(12) United States Patent
Shinada

(10) Patent No.: US 10,916,914 B2
(45) Date of Patent: Feb. 9, 2021

(54) LIGHT MODULE

(71) Applicant: Mitsubishi Electric Corporation, Tokyo (JP)

(72) Inventor: Takuro Shinada, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/493,470

(22) PCT Filed: May 17, 2017

(86) PCT No.: PCT/JP2017/018583
§ 371 (c)(1),
(2) Date: Sep. 12, 2019

(87) PCT Pub. No.: WO2018/211644
PCT Pub. Date: Nov. 22, 2018

(65) Prior Publication Data
US 2020/0136345 A1 Apr. 30, 2020

(51) Int. Cl.
*H01S 5/022* (2006.01)
*H05K 1/02* (2006.01)
(Continued)

(52) U.S. Cl.
CPC ...... *H01S 5/02492* (2013.01); *H01S 5/02276* (2013.01); *H01S 5/02469* (2013.01); *H05K 1/0203* (2013.01); *H05K 1/0237* (2013.01); *H05K 1/115* (2013.01); *H05K 1/181* (2013.01); *H01S 5/3013* (2013.01); *H05K 2201/066* (2013.01); *H05K 2201/10121* (2013.01)

(58) Field of Classification Search
CPC ......... H01S 5/3013; H01S 5/022; H01S 5/024
See application file for complete search history.

(56) References Cited

U.S. PATENT DOCUMENTS 10,748,836 B2 * 8/2020 Kaifuchi ............. H01S 5/02476
2003/0174753 A1 9/2003 Yabuki et al.
(Continued)

FOREIGN PATENT DOCUMENTS

JP H11-307875 A 11/1999
JP 5253495 B2 7/2013

OTHER PUBLICATIONS

International Search Report; Written Opinion; and Notification of Transmittal of the International Search Report and the Written Opinion of the International Searching Authority, or the Declaration issued in PCT/JP2017/018583; dated Jun. 27, 2017.
(Continued)

*Primary Examiner* — Tuan N Nguyen
(74) *Attorney, Agent, or Firm* — Studebaker & Brackett PC

(57) ABSTRACT

Included are a metal block, a first sub-mount fixed to the metal block, and a second sub-mount having an upper surface and a lower surface which is fixed to the first sub-mount via a metal layer. Also included are an optical element mounted on the upper surface of the second sub-mount and a high frequency line path which is formed on the upper surface of the second sub-mount and electrically connected to the optical element so as to cause a signal such as a high-frequency signal to be input to or output from the optical element. In addition, the metal layer is electrically connected to the metal block.

20 Claims, 2 Drawing Sheets

(51) Int. Cl.
*H05K 1/11* (2006.01)
*H01S 5/024* (2006.01)
*H05K 1/18* (2006.01)
*H01S 5/30* (2006.01)

(56) References Cited

U.S. PATENT DOCUMENTS

2011/0007762 A1* 1/2011 Fukuda ............... H01S 5/02236
372/36
2011/0051758 A1* 3/2011 Krejci .................... H01S 5/024
372/34

OTHER PUBLICATIONS

An Office Action mailed by the State Intellectual Property Office of the People's Republic of China dated Aug. 5, 2020, which corresponds to Chinese Patent Application No. 201780090696.3 and is related to U.S. Appl. No. 16/493,470.

* cited by examiner

LIGHT MODULE

FIELD

This invention relates to a light module.

BACKGROUND

The patent literature 1 discloses the fact that, in a case where a laser chip is to be mounted on a stage of a package, a difference in a coefficient of thermal expansion exists between the laser chip and the stage, as a result of which a stress is created in a laser chip due to the difference in the coefficient of thermal expansion. PTL 1 further discloses two methods for reducing the stress created in the laser chip. The first method involves ensuring a sufficiently large thickness of a solder layer when the laser chip is to be mounted on the stage using the solder layer. The second method is a method that includes forming a sub-mount on the stage using a solder layer and mounting the laser chip via the solder layer.

PRIOR ART

Patent Literature

Patent Literature 1: JP H11-307875 A

SUMMARY

Technical Problem

In a light module that includes an optical element such as a laser diode (LD), the optical element is often mounted on a metal block. In order to reduce thermal stress acting on the optical element due to the difference in linear expansion coefficient between the optical element and the metal block, a sub-mount having a linear expansion coefficient comparable to the linear expansion coefficient of the optical element is arranged between the optical element and the metal block. In this case, the optical element is provided on the sub-mount.

In a light module, in order to electrically connect the optical element to an external signal line path, a high frequency line path such as a microstripline is provided on the sub-mount. The impedance of the high frequency line path depends upon the thickness of the sub-mount and the line path width. For reduction in size of the sub-mount, it is preferable to reduce the line path width of the high frequency line path and reduce the thickness of the sub-mount. However, when the sub-mount is made thinner, the stress acting on the optical element from the metal block becomes larger.

Some examples described herein may address the above-described problem and some examples described herein may provide a light module suitable for miniaturization by reducing the size of the sub-mount below the high frequency line path while suppressing the stress acting on the optical element.

Means for Solving the Problems

In some examples a light module includes a metal block, a first sub-mount fixed to the metal block, a second sub-mount having an upper surface and a lower surface, the lower surface being fixed to the first sub-mount via a metal layer, an optical element mounted on the upper surface, and a high frequency line path formed on the upper surface, wherein the metal layer being electrically connected to the metal block.

Advantageous Effects of Invention

According to some examples the first sub-mount is provided on the metal block, the second sub-mount is provided on the first sub-mount, and the optical element and the high frequency line path are provided on the second sub-mount. The lower surface of the second sub-mount is electrically connected to the metal block. By virtue of this, it is made possible to reduce the size of the second sub-mount while suppressing the stress acting on the optical element, which makes it possible to provide a light module suitable for miniaturization.

DESCRIPTION OF EMBODIMENTS

A light module according to an embodiment will be described hereinbelow with reference to the drawings. The same or corresponding components will be assigned the same reference signs and redundant explanations thereof will not be repeated.

First Embodiment

Figure 1:
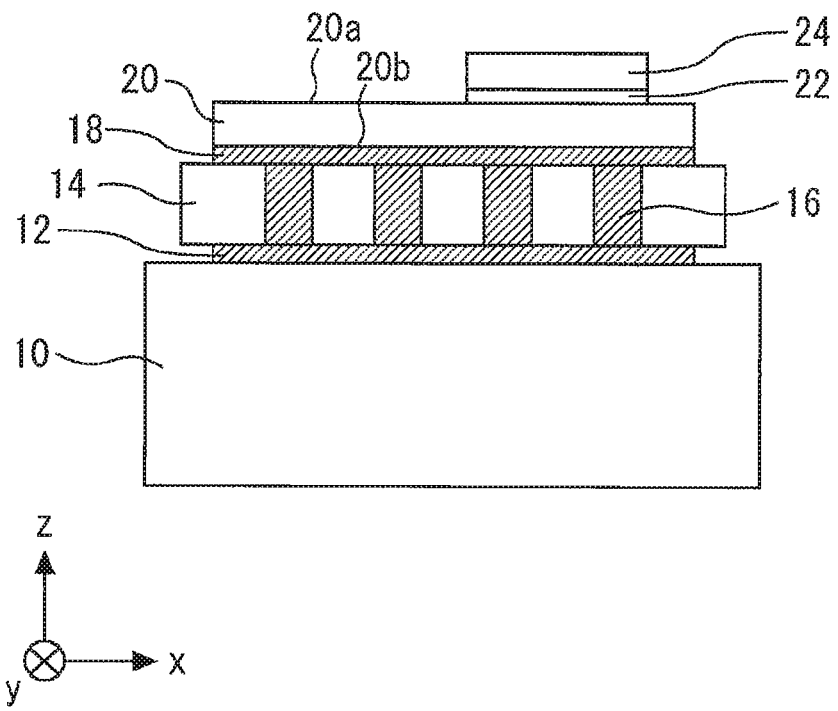
FIG. 1 is a cross-sectional view of a tight module according to a first embodiment.
Figure 1:
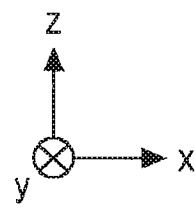

FIG. 1 is a cross-sectional view of a light module according to a first embodiment. The light module includes a metal block 10. Although there is no specific limitation for the material of the metal block 10 as long as it has a good thermal conductivity, copper-tungsten (CuW) may be mentioned as an example. The metal block 10 is a rectangular parallelepiped member. A first sub-mount 14 is fixed to the metal block 10 by a solder 12. Although there is no specific limitation for the material of the solder 12, Au—Sn alloys may be mentioned as an example. The first sub-mount 14 may be fixed to the metal block 10 using materials other than solder. For example, it is possible to use conductive adhesives. The first sub-mount 14 is a flat member.

A through hole is formed in the first sub-mount 14 and a through via 16 is provided in the through hole. The through via 16 enables electrical conduction between an upper surface and a lower surface of the first sub-mount 14.

A second sub-mount 20 is fixed to the upper surface of the first sub-mount 14 via a metal layer 18. The material of the metal layer 18 is, for example, a solder such as Au-Sn alloy or a conductive adhesive. The second sub-mount 20 is a flat member that has an upper surface 20*a* and a lower surface 20*b*. The lower surface 20*b* is fixed to the first sub-mount 14 via the metal layer 18. Also, the lower surface 20*b* is connected to the metal block 10 via the metal layer 18, the through via 16, and the solder 12. By virtue of this, the metal layer 18 is electrically connected to the metal block 10. In other words, the lower surface 20*b* and the metal block 10 are electrically connected to each other.

It is preferable that the metal layer 18 is formed on most of the lower surface 20b of the second sub-mount 20. The metal layer 18 is, for example, a solid pattern formed on the entire lower surface 20b of the second sub-mount 20.

An optical element 24 is mounted on the upper surface 20a by an adhesive 22. The optical element 24 is a semiconductor laser oscillator that employs an Indium Phosphide (InP) substrate. For example, an LED chip having sides of several hundred micrometers (rim) can be provided as the optical element 24. The linear expansion coefficient of the optical element 24 is in the order of $4.5 \times 10^6/°$ C. It is preferable that the above-described first sub-mount 14 and second sub-mount 20 be formed of a material having a linear expansion coefficient comparable to the linear expansion coefficient of the optical element 24. Accordingly, it is preferable that the first sub-mount 14 and the second sub-mount 20 be composed, for example, of ceramic materials such as aluminum nitride or metallic materials such as Kovar. In the case where the first sub-mount 14 is made of a metallic material, it is preferable that the material of the through via 16 be selected such that the electrical resistance of the through via 16 becomes smaller than the electrical resistance of the first sub-mount 14.

Figure 2:
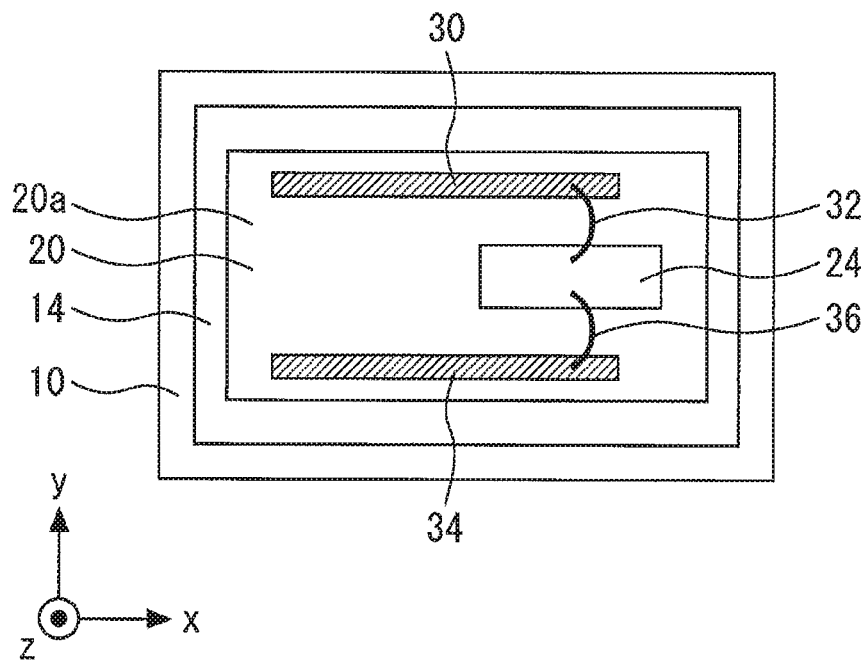
FIG. 2 is a plan view of the light module of FIG. 1.

FIG. 2 is a plan view of the light module of FIG. 1. High frequency line paths 30, 34 are formed on the upper surface 20a of the second sub-mount 20. The high frequency line paths 30, 34 are linear conductor foils. The material of the high frequency line paths 30, 34 is, for example, a metal such as gold. The high frequency line paths 30, 34 can be funned using methods such as vapor deposition and plating. As the high frequency line paths 30, 34 are provided on the upper surface 20a of the second sub-mount 20 with the metal layer 18 formed on the lower surface 20b of the second sub-mount 20, a microstripline is formed. The high frequency line paths 30, 34 function as a signal pattern and the metal layer 18 functions as a ground pattern.

An anode and a cathode are provided in the upper surface of the optical element 24 which is a semiconductor laser oscillator. The anode and the high frequency line path 30 are connected to each other via a wire 32 and the cathode and the high frequency line path 34 are connected to each other via a wire 36. The impedance of the microstripline depends upon the substrate thickness of the second sub-mount 20 and the line path widths of the high frequency line paths 30, 34. A smaller substrate thickness of the second sub-mount 20 leads to a smaller line path widths of the high frequency line paths 30, 34 while the same impedance is maintained. Hence, in order to achieve miniaturization of the light module, it is preferable to make the second sub-mount 20 thinner.

Here, a comparative example may be described in order to facilitate understanding of the significance of the light module according to the first embodiment. A light module according to the comparative example has one sub-mount on its metal block and has an optical element and a high frequency line path on the sub-mount. Consider a case where the thickness of the sub-mount is set to 0.4 mm, a ceramic component whose electric permittivity is 9 is used as the sub-mount, and a high frequency line path with an impedance of 25Ω is to be formed so as to suppress the stress acting on the optical element due to thermal strain. In this case, the line path width of the high frequency line path will be 1.30 mm. The line path width of the high frequency line path corresponds to the length in the y-direction in FIG. 2. In order to provide two high frequency line paths, one of which is for the anode of the optical element and the other of which is for the cathode, it is necessary that the width of the sub-mount be in the order of 3 mm. If it is so, miniaturization of the light module cannot be achieved.

In view of the above, a case should be examined where the thickness of the second sub-mount 20 is set, for example, to 0.1 mm and the thickness of the first sub-mount 14 is set, for example, to 0.3 mm in the light module according to the first embodiment. In this case, since the sum of the thickness of the first sub-mount 14 and that of the second sub-mount 20 is 0.4 mm, the effect of suppression of the stress on the optical element 24 is of the same or similar level as that of the comparative example. Further, since the thickness of the second sub-mount 20 is 0.1 mm, which is small, it is made possible to reduce the line path widths of the high frequency line paths 30, 34 to 0.32 mm Even when the requirement is considered that two high frequency line paths 30, 34 should be provided for the anode and cathode of the optical element 24, it is still possible to bring the width of the second sub-mount 20 into the range of 1 mm or less. This is very small as compared with 3 mm which is the width of the sub-mount according to the comparative example.

As will be appreciated from the foregoing, the second sub-mount 20 can be reduced in size when the thickness of the second sub-mount 20 is smaller than 0.4 mm, which is the thickness of the sub-mount of the comparative example. In other words, the plane area of the second sub-mount 20 can be reduced. By reducing the plane area of the second sub-mount 20, the plane area of the first sub-mount 14 can also be reduced. Hence, the sum of the volume of the first sub-mount 14 and that of the second sub-mount 20 is smaller than the volume of the sub-mount according to the comparative example.

Since a thicker second sub-mount 20 leads to a larger sum of the volume of the first sub-mount 14 and that of the second sub-mount 20, it is preferable that the thickness of the second sub-mount 20 be set, for example, to 0.2 mm or less. It is more preferable that the second sub-mount 20 be thinner than the first sub-mount 14.

As the second sub-mount 20 becomes thinner, the sum of the volume of the first sub-mount 14 and that of the second sub-mount 20 can he made smaller. However, if the second sub-mount 20 is made excessively thin, it will not be possible to ensure the mechanical strength of the second sub-mount 20. In view of this, it is preferable that the lower limit of the thickness of the second sub-mount 20 be set, for example, to 0.05 mm. In view of the above discussion, by providing the ceramic second sub-mount 20 with a thickness of 0.05 mm or more and 0.2 mm or less, it is made possible to ensure the mechanical strength of the second sub-mount 20 while reducing the sum of the volume of the first sub-mount 14 and that of the second sub-mount 20.

As will be appreciated from the foregoing, the light module according to the first embodiment enables reduction in the thickness of the second sub-mount 20 and thereby makes it possible to reduce the line path widths of the high frequency line paths 30, 34 while ensuring impedance matching, so that it is made possible to make the second sub-mount 20 smaller. Furthermore, by providing the first sub-mount 14 between the metal block 10 and the second sub-mount 20, it is made possible to reduce the stress acting on the optical element 24 as compared to a case where the first sub-mount 14 is not provided.

The thermal stress acting between the second sub-mount 20 and the optical element 24 is reduced as the sum of the thicknesses of the first: and second sub-mounts 14, 20 increases. As a result, even when the second sub-mount 20 is made thinner, it is made possible to reduce the stress acting on the optical element 24 by increasing the thickness of the first sub-mount 14. Accordingly, it is made possible to provide a light module suitable for miniaturization by reducing the size of ate second sub-mount 20 below the high frequency line paths 30, 34 while suppressing the stress acting on the optical element 24.

Various modifications may be made to the light module according to the first embodiment to the extent that characterizing features thereof are not lost. For example, the optical element 24 may be provided as an element other than a semiconductor laser oscillator. As the optical element 24, a photodiode (PD), an avalanche photodiode (APD), a PIN photodiode, an optical modulator or an optical modulator integrated laser, etc. may be employed.

The electrical connection between the metal layer 18 and the metal block 10 is established by providing the through via 16 that extends through the first sub-mount 14 and electrically connects the metal layer 18 to the metal block 10. However, the metal layer 18 and the metal block 10 may be electrically connected to each other by any method other than the through via 16.

While the first sub-mount 14 and the second sub-mount 20 are made of the same material, different materials may be employed. In that case, the sum of the thicknesses of the first and second sub-mounts 14, 20 may be different from the thickness of the sub-mount according to the comparative example. The modified examples mentioned in the context of the first embodiment can be applied to the light modules according to the following embodiments. It should be noted that, since the light modules according to the following embodiments have many similarities with the light module of the first embodiment, descriptions will focus on the features different than those of the light module of the first embodiment.

Second Embodiment

Figure 3:
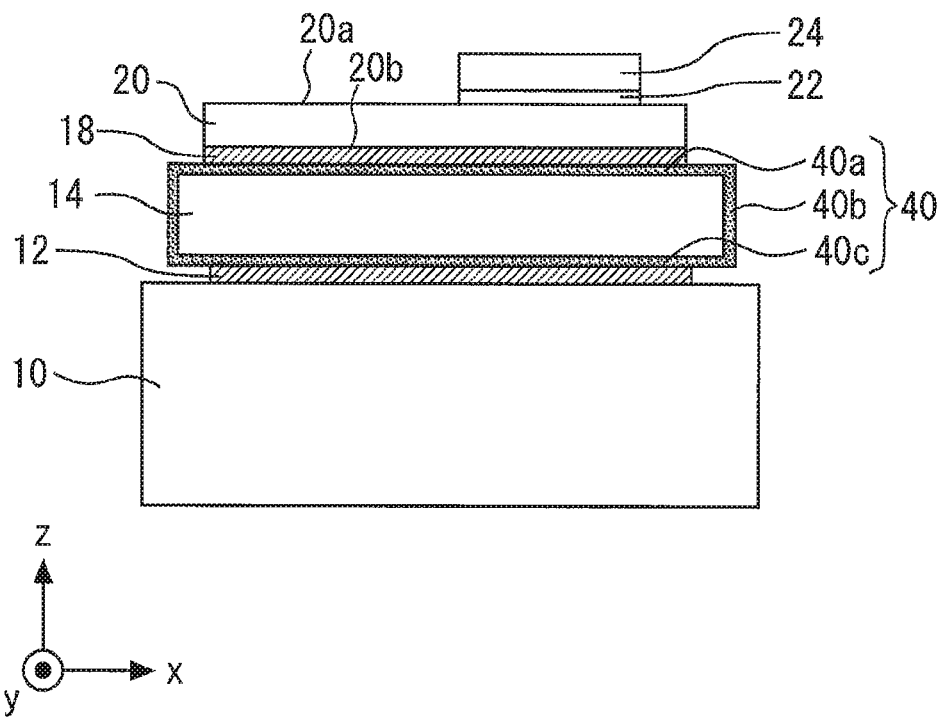
FIG. 3 is a cross-sectional view of the light module according to a second embodiment.

FIG. 3 is a cross-sectional view of the light module according to a second embodiment. The first sub-mount 14 is covered by a metal unit 40. The metal unit 40 can be formed by metallizing the first sub-mount 14. The metal unit 40 includes an upper surface portion 40a provided on the upper surface of the first sub-mount 14, a side portion 40b provided on the side surface of the first sub-mount 14, and a lower surface portion 40c provided on the lower surface of the first sub-mount 14. The upper surface portion 40a is continuous to the side portion 40b. The side portion 40b is continuous to the lower surface portion 40c. The upper surface portion 40a is in contact with the metal layer 18. The lower surface portion 40c is in contact with the solder 12 and thereby electrically connected to the metal block 10.

The light module according to the second embodiment provides the metal unit 40 as a means for electrically connecting the metal layer 18 to the metal block 10. By electrically connecting the metal layer 18 to the metal block 10, it is made possible to provide the first sub-mount 14 without affecting the impedance of the high frequency line paths 30, 34.

There is no limitation for the range where the metal unit 40 should be formed as long as the metal unit 40 can electrically connect the metal layer 18 to the metal block 10. For example, the metal unit 40 may be provided at a portion of the first sub-mount 14 and the metal layer 18 and the metal block 10 may be electrically connected to each other via the metal unit 40.

Third Embodiment

Figure 4:
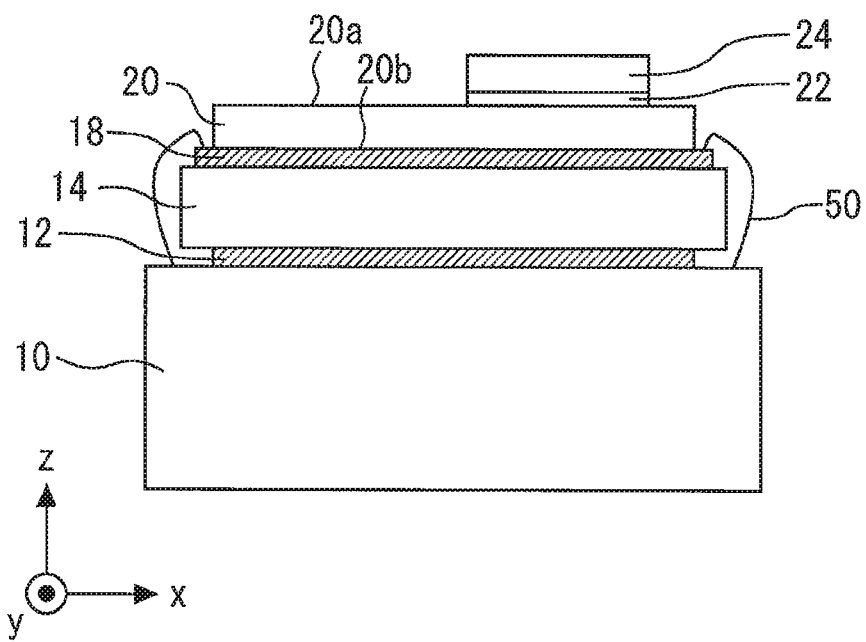
FIG. 4 is a cross-sectional view of the light module according to a third embodiment.

FIG. 4 is a cross-sectional view of the light module according to a third embodiment. The metal layer 18 and the metal block 10 are electrically connected to each other by a wire 50. By electrically connecting the metal layer 18 to the metal block 10 by the wire 50, it is made possible to provide the first sub-mount 14 without affecting the impedance of the high frequency line paths 30, 34. It should he noted that the features of the light modules according to the above-described embodiments may be used in combination.

DESCRIPTION OF SYMBOLS 10 metal block, 14 first submount, 18 metal layer, 20 second sub-mount, 22 adhesive, 24 optical element

The invention claimed is:

1. A light module comprising:
a metal block;
a first sub-mount fixed to the metal block;
a second sub-mount having an upper surface and a lower surface, the lower surface being fixed to the first sub-mount via a metal layer;
an optical element mounted on the upper surface; and
a high frequency line path formed on the upper surface, wherein
the metal layer being electrically connected to the metal block.

2. The light module according to claim 1, comprising a through via that extends through the first sub-mount and electrically connects the metal layer to the metal block.

3. The light module according to claim 2, comprising a solder that joins the metal block to the first sub-mount, wherein
a material of the metal layer is solder.

4. The light module according to claim 3, wherein the first sub-mount and the second sub-mount are ceramic.

5. The light module according to claim 2, wherein the first sub-mount and the second sub-mount are ceramic.

6. The light module according to claim 2, wherein the second sub-mount is ceramic with a thickness of 0.05 mm or more and 0.2 mm or less.

7. The light module according to claim 1, comprising a metal unit that covers the first sub-mount, the metal unit being in contact with the metal layer and electrically connected to the metal block.

8. The light module according to claim 7, comprising a solder that joins the metal block to the first sub-mount, wherein
a material of the metal layer is solder.

9. The light module according to claim 8, wherein the first sub-mount and the second sub-mount are ceramic.

10. The light module according to claim 7, wherein the first sub-mount and the second sub-mount are ceramic.

11. The light module according to claim 7, wherein the second sub-mount is ceramic with a thickness of 0.05 mm or more and 0.2 mm or less.

12. The light module according to claim 1, comprising a wire that electrically connects the metal layer to the metal block.

13. The light module according to claim 12, comprising a solder that joins the metal block to the first sub-mount, wherein
a material of the metal layer is solder.

14. The light module according to claim 13, wherein the first sub-mount and the second sub-mount are ceramic.

15. The light module according to claim 12, wherein the first sub-mount and the second sub-mount are ceramic.

16. The light module according to claim 1, comprising a solder that joins the metal block to the first sub-mount, wherein
a material of the metal layer is solder.

17. The light module according to claim 16, wherein the first sub-mount and the second sub-mount are ceramic.

18. The light module according to claim 1, wherein the first sub-mount and the second sub-mount are ceramic.

19. The light module according to claim 1, wherein the second sub-mount is ceramic with a thickness of 0.05 mm or more and 0.2 mm or less.

20. The light module according to claim 1, wherein the second sub-mount is thinner than the first sub-mount.

* * * * *